United States Patent
Nistler et al.

[11] Patent Number: 5,990,488
[45] Date of Patent: Nov. 23, 1999

[54] USEABLE DROP-IN STRATEGY FOR CORRECT ELECTRICAL ANALYSIS OF SEMICONDUCTOR DEVICES

[75] Inventors: John L. Nistler, Martindale, Tex.; Charles E. May, Gresham, Oreg.; Kenneth J. Morrissey, Austin, Tex.

[73] Assignee: Advanced Micro Devices, Inc., Sunnyvale, Calif.

[21] Appl. No.: 09/224,971
[22] Filed: Jan. 4, 1999
[51] Int. Cl.⁶ .................................................. H01L 23/58
[52] U.S. Cl. .............................. 257/48; 257/786; 257/206
[58] Field of Search ............................... 257/48, 202, 204, 257/206, 210, 786, 723, 724

[56] References Cited

U.S. PATENT DOCUMENTS

| | | |
|---|---|---|
| 4,467,400 | 8/1984 | Stopper . |
| 4,479,088 | 10/1984 | Stopper . |
| 4,517,659 | 5/1985 | Chamberlain . |
| 4,920,454 | 4/1990 | Stopper et al. . |
| 5,309,011 | 5/1994 | Tazunoki et al. . |
| 5,391,892 | 2/1995 | Devereaux et al. . |
| 5,514,884 | 5/1996 | Hively et al. . |
| 5,648,661 | 7/1997 | Rostoker et al. . |
| 5,654,588 | 8/1997 | Dasse et al. . |

OTHER PUBLICATIONS

Stanley Wolf and Richard N. Tauber; *Silicon Processing for the VLSI Era, vol. 3—The Submicron MOSFET*; pp. 325–329; 1995.

*Primary Examiner*—Sheila V. Clark
*Attorney, Agent, or Firm*—Timothy M. Honeycutt

[57] ABSTRACT

A semiconductor wafer incorporating process control monitors and a method of incorporating the same are provided. In one aspect, the semiconductor wafer has a plurality of fields formed in a pattern thereon that is subdivided into n zones and has a center point. The semiconductor wafer is provided with a plurality of integrated circuits each of which is positioned in one of the plurality of fields. The semiconductor wafer also includes a plurality of diagnostic integrated circuits dispersed in a pattern. The pattern is such that each of the plurality of diagnostic integrated circuits is positioned in one of the plurality fields, one of the plurality of diagnostic integrated circuits is positioned in each of the n zones, and a circle of radius R from the center point will intersect at least one of the plurality of diagnostic integrated circuits where R is greater than or equal to the distance between the center point and the innermost of the plurality of diagnostic integrated circuits and less than or equal to the distance between the center point and the outermost of the plurality of diagnostic integrated circuits.

21 Claims, 3 Drawing Sheets

USEABLE DROP-IN STRATEGY FOR CORRECT ELECTRICAL ANALYSIS OF SEMICONDUCTOR DEVICES

BACKGROUND OF THE INVENTION

1. Field of the Invention

This invention relates generally to semiconductor processing, and more particularly to structure and method for implementing diagnostic integrated circuits on a semiconductor wafer.

2. Description of the Related Art

Testing has been an integral component of semiconductor processing since the development of the earliest germanium-based bipolar integrated circuits. The need for testing then and now stems from both engineering and economic considerations. Circuit designers must be able to verify that circuits designed on paper and simulated on computer, work as intended when implemented in actual silicon. Similarly, process engineers must be able to track the behavior of the multitude of individual process steps used to fabricate a given integrated circuit. From an economic standpoint, it is critical for semiconductor manufacturers to be able to quickly pinpoint the origin of unacceptable yields so that the circuit design or the fabrication process may be altered as necessary without needlessly wasting lots of wafers that may cost several hundred thousand dollars or more.

Electrical and process verification testing of most integrated circuits is provided by test structures that are incorporated into a semiconductor wafer during the process of fabricating the various operational integrated circuits (e.g., microprocessors, random access memories, etc.) thereon. The test structures are designed to provide electrical verification test data on various components of the operational integrated circuits as well as verification of many of the myriad of process steps performed during the fabrication of the operational integrated circuits. In modem test structures, well over a hundred or more different types of parameters are routinely captured by the test structures.

Early test structures consisted of individual die commonly known as process control monitors ("PCM") that were placed in various die locations across the face of a given wafer and fabricated in concert with the surrounding operational integrated circuits. This type of test structure prevailed throughout the period of semiconductor manufacturer when 1× reticles were used for direct print or contact printing or projection scanning of semiconductor devices. Early in the last decade, the semiconductor industry transitioned away from 1× reticle processing in favor of lithographic stepping. As a consequence, PCMs as test structures were largely abandoned in favor of scribe line monitors ("SLM").

There are several disadvantages associated with conventional structures and methods for implementing PCMs and SLMs. In the conventional design and fabrication of PCMs, little attention has been paid to the tailoring of the configuration of a given PCM relative to surrounding operational integrated circuits or the particular dispersal of PCMs across the face of a given wafer. Manufacturing experience has demonstrated that the differences in the structural densities of the PCM and the surrounding operational integrated circuits can significantly degrade the yield of those operational integrated circuits that do surround a particular PCM. The differential structural density between a given PCM and the operational integrated circuits that surround it impacts the behavior of various etch and polish steps that are performed on the wafer. A given conventional PCM typically has a much lower structural density, that is, number and/or size of physical structures, e.g. gates, metallization lines, isolation structures, etc. per unit area than the surrounding operational integrated circuits, which typically have many more circuit devices and structures per unit area. As a result, etchants and polish solvents may be more aggressively consumed by the less structurally dense areas in the PCM than in the surrounding operational integrated circuits, resulting in inadequate etching and/or polishing of certain structures in the operational integrated circuits. The problem of differential structural density is further compounded by the fact that the die borders for conventional PCMs are routinely much larger than the die borders for the surrounding operational integrated circuits.

Conventional SLMs do not present the same types of yield problems associated with conventional PCMs. However, conventional SLMs often cannot provide sufficient electrical data. The problem is primarily one of packing density. SLMs are, as the name implies, fabricated in the scribe lines. Space is accordingly limited. As die sizes have increased to accommodate more complex circuits, the number of different test parameters and thus SLMs that are required has increased proportionally. However, it is frequently difficult to pack the requisite number of SLMs into the confined spaces of the scribe lines. Thus, compromises in the amount of date gathered must be made.

Another short coming common to both conventional PCM and SLM techniques is the propensity to inadequately capture data on certain types of process variations that can propagate at various locations on a given wafer. Process variations can occur during many of the scores of process steps performed on a wafer during integrated circuit manufacture. Many of these are due to the dynamics of heat transfer across a flat disk. For example, during the formation of a thermal oxide layer on a given wafer, a band or ring of the thermal oxide may develop with a significant variation from the anticipated nominal thickness. The band itself may have a uniform thickness that deviates from the anticipated nominal thickness of the rest of the film or may exhibit a gradient. In either event, if the band of variable thickness does not form over one of the appropriate test structures fabricated on the wafer, the extent and impact of the area of process variation may not be adequately characterized so that its origin may be determined and appropriate modifications to the process flow may be made to eliminate it.

Some conventional process flows avoid the problem of degraded yield due to the impact of PCM fabrication on adjacent operational integrated circuits by utilizing dedicated test wafers upon which only test structures are fabricated. While this technique avoids the aforementioned yield problems, data acquired from dedicated test wafers does not necessarily correlate well with the behavior of the electrical circuits and the processes used to form them on actual production wafers.

The present invention is directed to overcoming or reducing the effects of one or more of the foregoing disadvantages.

SUMMARY OF THE INVENTION

In accordance with one aspect of the present invention, a semiconductor wafer that has a plurality of fields formed in a pattern thereon that is subdivided into n zones and has a center point is provided. The semiconductor wafer includes a plurality of integrated circuits each of which is positioned in one of the plurality of fields. The semiconductor wafer also includes a plurality of diagnostic integrated circuits dispersed in a pattern. The pattern is such that each of the plurality of diagnostic integrated circuits is positioned in one of the plurality fields, one of the plurality of diagnostic integrated circuits is positioned in each of the n zones, and a circle of radius R from the center point will intersect at least one of the plurality of diagnostic integrated circuits where R is greater than or equal to the distance between the center point and the innermost of the plurality of diagnostic integrated circuits and less than or equal to the distance between the center point and the outermost of the plurality of diagnostic integrated circuits.

In accordance with another aspect of the present invention, a semiconductor wafer is provided that includes a plurality of intersecting scribe lines that define a plurality of fields on the semiconductor wafer. A plurality of integrated circuits is provided where each of the plurality of integrated circuits being positioned in one of the plurality of fields. A plurality of diagnostic integrated circuits is also provided. Each of the plurality of diagnostic integrated circuits is positioned in one of the plurality of fields and surrounded by a border that has a plurality of inactivated circuit devices that have substantially the same layout as a corresponding plurality of active circuit devices in one of the plurality of integrated circuits.

In accordance with another aspect of the present invention, a semiconductor wafer that has a plurality of fields formed in a pattern thereon that is subdivided into seven zones and has a center point is provided. The semiconductor wafer includes a plurality of integrated circuits. Each of the plurality of integrated circuits is positioned in one of the plurality of fields. A plurality of diagnostic integrated circuits is also included. Each of the plurality of diagnostic integrated circuits is positioned in one of the plurality of fields and surrounded by a border. The border has a plurality of inactivated circuit devices having substantially the same layout as a corresponding plurality of active circuit devices in one of the plurality of integrated circuits. The plurality of diagnostic integrated circuits is dispersed in a pattern such that one of the pluralities of diagnostic integrated circuits is positioned in each of the seven zones, and a circle of radius R from the center point will intersect at least one of the pluralities of diagnostic integrated circuits where R is greater than or equal to the distance between the center point and the innermost of the plurality of diagnostic integrated circuits and less than or equal to the distance between the center point and the outermost of the plurality of diagnostic integrated circuits.

In accordance with another aspect of the present invention, a method of fabricating a diagnostic integrated circuit on a semiconductor wafer that has a plurality of fields patterned thereon with a center point is provided. The method includes the steps forming an integrated circuit in one of the plurality of fields and a diagnostic integrated circuit in another of the plurality of fields positioned adjacent to the integrated circuit. The diagnostic integrated circuit has a border that has a plurality of inactivated circuit devices having substantially the same layout as a corresponding plurality of active circuit devices in one of the plurality of integrated circuits.

In accordance with another aspect of the present invention, a method of fabricating a plurality of diagnostic integrated circuits on a semiconductor wafer that have a plurality of fields patterned thereon with a center point is provided. The method includes the steps of subdividing the pattern of fields into n zones and forming a plurality of integrated circuits, each of which is positioned in one of the plurality of fields. A plurality of diagnostic integrated circuits are formed. Each of the plurality of diagnostic integrated circuits is positioned in one of the plurality of fields and is surrounded by a border having a plurality of inactivated circuit devices that has substantially the same layout as a corresponding plurality of active circuit devices in one of the plurality of integrated circuits. The plurality of diagnostic integrated circuits are dispersed in a pattern whereby one of the plurality of diagnostic integrated circuits is positioned in each of the n zones, and a circle of radius R from the center point will intersect at least one of the plurality of diagnostic integrated circuits where R is greater than or equal to the distance between the center point and the innermost of the plurality of diagnostic integrated circuits and less than or equal to the distance between the center point and the outermost of the plurality of diagnostic integrated circuits.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
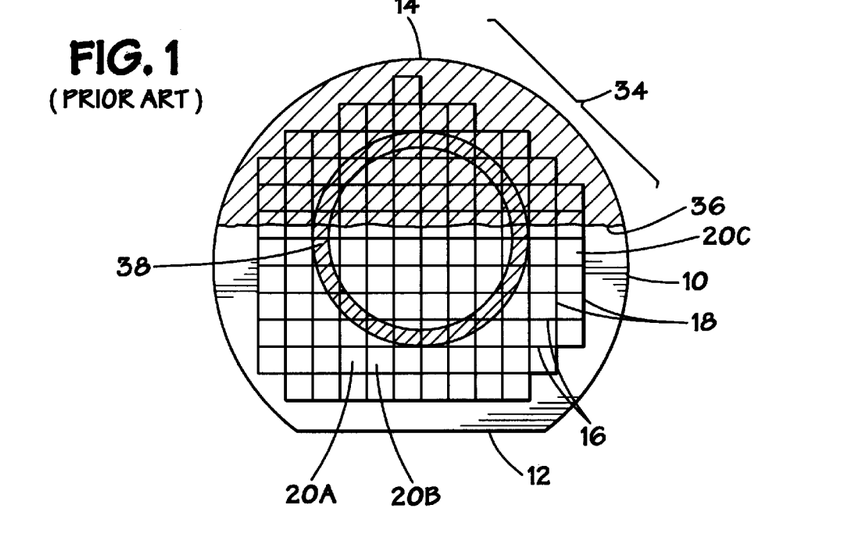
FIG. 1 is a plan view of an exemplary conventional semiconductor wafer.
Figure 2:
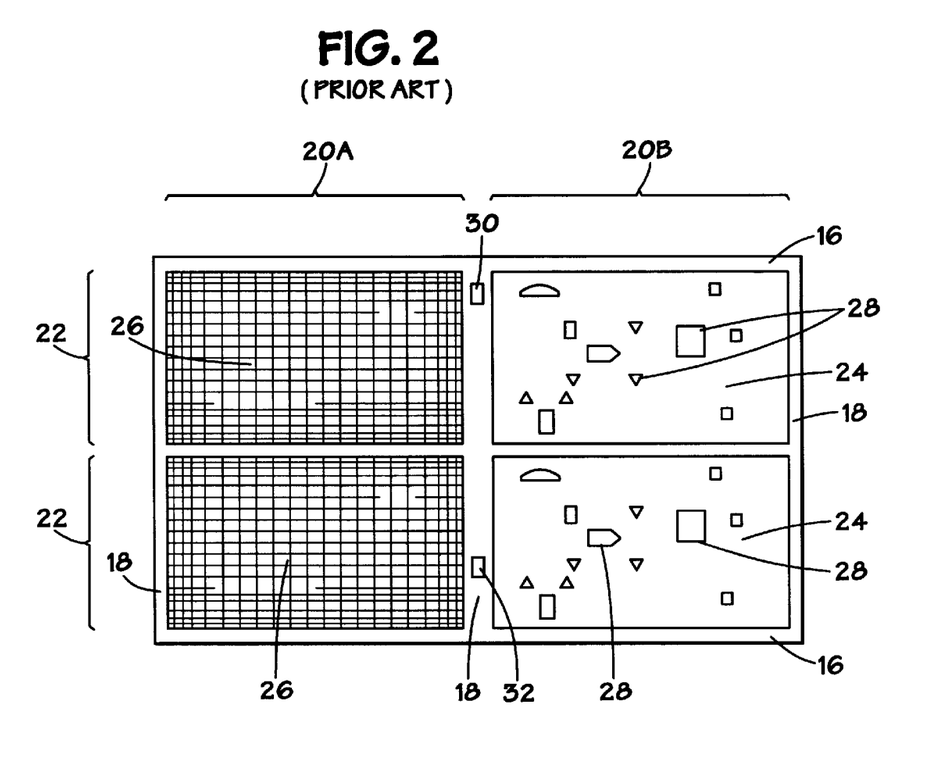
FIG. 2 is a highly magnified plan view of side-by-side fields of the semiconductor wafer depicted in FIG. 1 showing pairs of operational integrated circuits and typical conventional PCMs and SLMs.

In the drawings described below, reference numerals are generally repeated where identical elements appear in more than one figure. Turning now to the drawings, FIGS. 1 and show, respectively, a plan view of an exemplary conventional semiconductor wafer 10, and a highly magnified plan of a selected portion of the wafer 10 depicted in FIG. 1. FIGS. 1 and 2 are provided to illustrate two common types of conventional test devices used for electrical and process verification of semiconductor wafers. The wafer 10 includes a primary fiat 12 and a crown 14 positioned in opposition to the flat 12. A plurality of intersecting horizontal and vertical scribe lines 16 and 18 delineate and define a plurality of fields, three of which are designated 20a, 20b and 20c. The structure of the fields 20a, 20b and 20 in general may be understood by referring now also to FIG. 2, which is a highly magnified plan view of the fields 20a and 20b. Two operational die 22 are positioned in the field 20a. Two test die 24 are positioned in the field 20b. The operational die 22 contain respective pluralities of circuit devices that are shown schematically and designated 26. The test die 24 contain respective pluralities of circuit devices, which are schematically represented and designated 28. Note that the structural density, that is, the number of structural features, such as gates, metal lines, etc. per unit area is much greater for the die 22 than for the test die 24. This is a common outcome in conventional fabrication of test die since modern integrated circuits frequently contain millions of individual circuit devices whereas process control monitors or test die frequently contain substantially fewer circuit devices as these types of test circuits require fewer devices to implement their particular logic functions.

A pair of exemplary conventional scribe line monitors ("SLMs") 30 and 32 are also depicted in FIG. 2. The SLMs 30 and 32 are typically discrete devices that are fabricated in the scribe lines 16 and/or 18 during the fabrication of the die 22 and/or the test die 28. SLMs, such as those depicted, are much more frequently incorporated into modern semiconductor wafers than the test die 24. A typical conventional wafer may contain hundreds or thousands of such SLMs.

FIGS. 1 and 2 illustrate some of the difficulties associated with conventional methods and devices for obtaining electrical performance and process verification data from a given wafer. As noted above, process variations are an inevitable outcome of the multitudes of different material growth, deposition, removal and heating steps that go into the fabrication of integrated circuits on a wafer. Two exemplary types stemming from the dynamics of transferring heat to the wafer 10 will now be described. The shaded area 34 on the wafer 10 extending from the crown 14 downward to a point above the approximate center of the wafer 10 represents an area of the wafer 10 that experienced a thickness gradient in the thickness of a particular layer formed on the wafer 10 during the processing of the various die 22 and test die 24 thereon. The shaded area 34 may represent, for example, a portion of a thermally grown oxide layer. The formation of the area of thickness variation 34 is the result of uneven heating of the wafer 10 during thermal processing. In almost all conventional thermal processes, wafers are inserted into heating chamber, such as a rapid thermal anneal ("RTA") chamber or diffusion tube furnace, crown first, that is, by inserting the wafer 10 with the crown 14 entering the furnace first. As a result, the portion of the wafer 10 at and near the crown 14 is subjected to high temperature for a slightly longer period of time than the portions of the wafer 10 nearer the primary flat 12. Although the entire wafer 10 quickly assumes a relatively uniform temperature, the convective and radiative heat transfer from the furnace to the wafer 10 is not fast enough to compensate for the initial and slightly longer heating of the portion of the wafer 10 near the crown 14. As a result, the area 34 will have a slightly larger thickness than the portion of the thermally grown oxide outside the area 34. The thickness of the area 34 will be directionally dependent, that is, thickest at the crown 14 and decreasing to a nominal thickness at the border 36 between the affected area 34 and the remainder of the wafer 10.

Another phenomenon that may occur is the establishment of a ring or band 38 in a film formed on the wafer 10. The film may be the aforementioned thermal oxide or another type of material. The ring 38 constitutes an area of the film that deviates in properties from the expected norm for the film. The deviation along the width of the ring 38 may be uniform or directional dependent. The establishment of the ring 38 is a product of the physics of conductive heat transfer across a flat disc in the presence of the relatively ubiquitous application of convective and radiative heat transfer in a typical RTA or furnace process. The width and position of the band 38 depend upon a large number of factors, such as the type of thermal process involved, and the composition of the wafer 10, to name just a few. The band 38 may or may not impact the ultimate yield of the wafer 10.

From a quality control standpoint, it is highly desirable to be able to accurately determine the extent and effect of the areas of significant process variation, such as the area 34 and the band 38. Note, however, that the test die 24 in the field 20b are not positioned within either of the areas of process variation 34 or 38. Accordingly, those test structures 24 will not generate test data on the areas of process variation 34 and 38. Indeed, the effect of the band 38 may go completely undetected unless the band 38 happens to form over one of the test structures 24 on the wafer 10. In conventional fabrication, this occurrence may be largely a matter of chance. Similarly, if no test structures 24 are implemented in any of the fields positioned within the area of process variation 34, the effect of the area of process variation 34 may not be adequately interpreted and a remedy, if called for, may be difficult to ascertain.

Two other problems stem from the conventional method of fabricating PCMs, such as the test die 24, that can significantly impact the yield of die that surround the test die 24, such as the die 22. As noted above, the structural densities of the die 22 are significantly greater than the structural densities of the test die 24. As a result, the field 20b may absorb much more of the various processing materials that are exposed to the wafer 10 during a given processing step, such as etchants, chemical-mechanical-polishing ("CMP") solvents or the like. As a result, various layers on the actual operational die 22 may be either inadequately formed or inadequately removed due to the excessive consumption of etchants, solvents, etc. by the much high structural density test die 24. The problem is most acute near the outer edges of the operational die adjacent the test die 24. Presently, little effort is made in conventional processing to layout and dimension test die so that the structural densities of test die match the structural densities of surrounding operational die.

Figure 3:
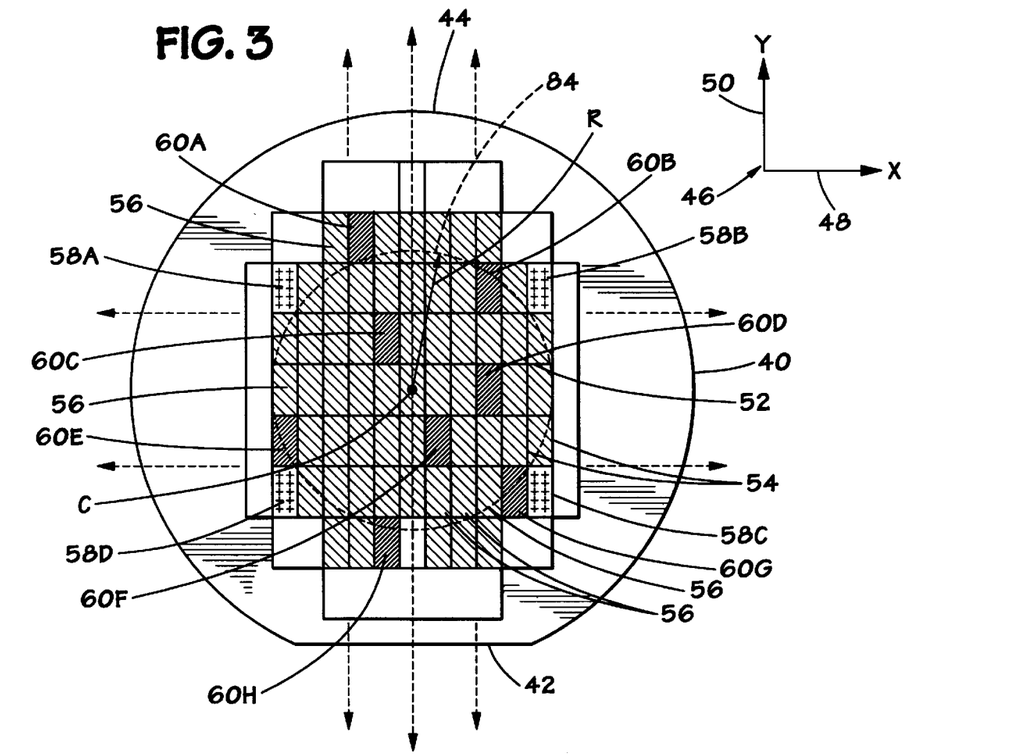
FIG. 3 is a plan view of an exemplary embodiment of a semiconductor wafer incorporating a selected portion of the fields patterned thereon dedicated to diagnostic integrated circuits and dispersed in a preselected pattern in accordance with the present invention.
Figure 4:
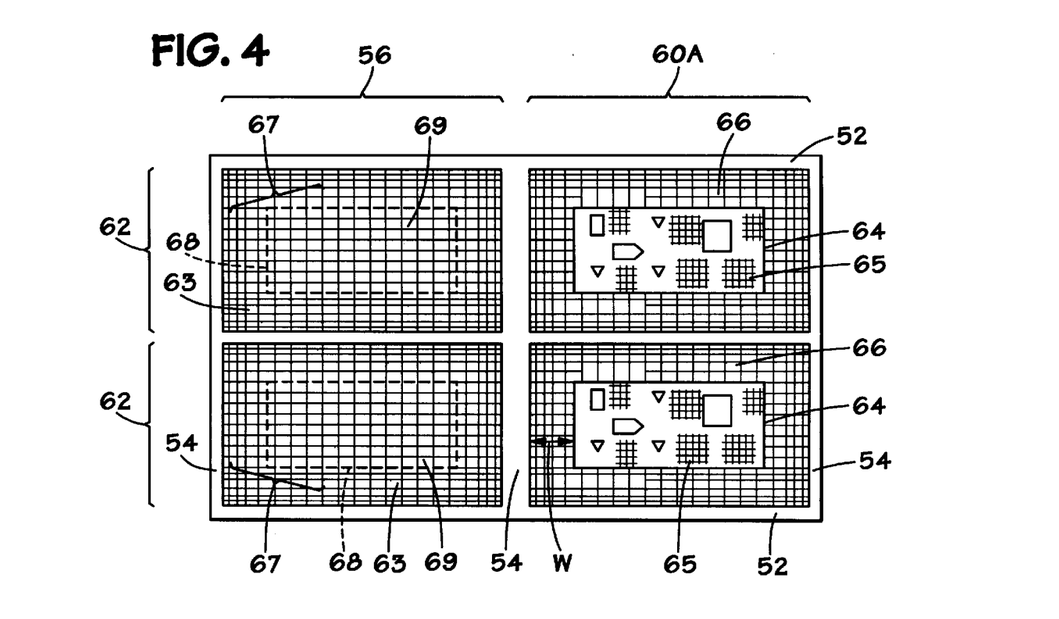
FIG. 4 is a highly magnified plan view of two side-by-side fields depicted in FIG. 3.
Figure 5:
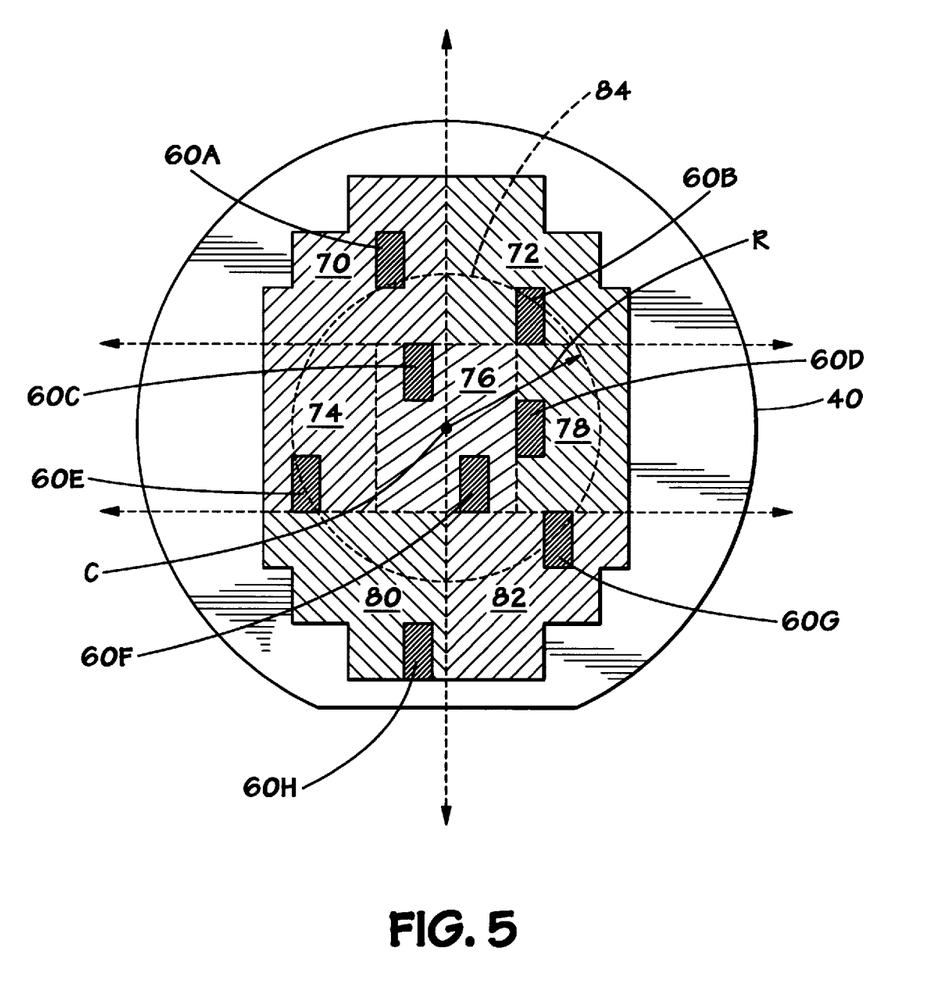
FIG. 5 is a plan view like FIG. 3, but highly simplified to reveal the dispersal pattern of the fields dedicated to diagnostic integrated circuit implementation in accordance with the present invention.

An exemplary structure and method for incorporating drop-in PCMs into a semiconductor wafer may be understood by referring now to FIGS. 3, 4 and 5. As described in detail below, the apparatus and method in accordance with the present invention alleviate the difficulty of accurately obtaining diagnostic data for wafers exhibiting areas of significant process variation as shown in FIGS. 1 and 2, as well as the yield problems associated with the conventional fabrication of PCMs. FIG. 3 depicts a plan view of an exemplary semiconductor wafer 40 that is provided with a primary flat 42 and an oppositely disposed crown 44. The wafer 40 may be composed of a variety of semiconductor materials, such as silicon, germanium or the like. Alternatively, the wafer 40 may be a silicon-on insulator, such as silicon-on-sapphire or the like. In the embodiment illustrated, the wafer 40 is a composite structure of a base substrate of lightly doped silicon and an overlying blanket epitaxially grown silicon layer. To facilitate the illustration of various structures on the wafer 40, an x-y axis 46 is shown with a x-axis 48 and a y-axis 50. A first plurality of scribe lines 52 and a second plurality of scribe lines 54 intersecting the first plurality of scribe lines 52, are patterned in the surface of the wafer 40 using well-known techniques for establishing scribe lines. The scribe lines 52 are disposed in a generally parallel relation to the x-axis 48 and the scribe lines 54 are positioned in a generally parallel relation to the y-axis 50. The intersecting pluralities of scribe lines 52 and 54 delineate and define a plurality of fields 56. Non-orthogonal intersection of the scribe lines 52 and 54 is possible.

Four of the fields, designated 58a, 58b, 58c and 58d are set aside for the implementation of alignment markers to facilitate the alignment of various optical equipment used to process the wafer 40. Eight of the fields designated 60a, 60b, 60c, 60d, 60e, 60f, 60g and 60h are selected for the implementation of diagnostic integrated circuits to be formed thereon. The remaining fields, designated 56, are set aside for the implementation of operational integrated circuits.

The detailed structure of the field 60a and an adjacent field 56 may be understood by referring now to FIG. 4, which is a highly magnified plan view of the fields 56 and 60a. The structures of the fields 60a and 56 shown in FIG. 4 are respectively illustrative of the fields 56 and the fields 60b, 60c, 60d, 60e, 60f, 60g and 60h. Two integrated circuits 62 are implemented in the field 56. Each of the integrated circuits 62 includes a large number of individual circuit devices that are depicted schematically and designated 63. The integrated circuits 62 may be virtually any type of integrated circuit fabricated in semiconductor processing, such as, for example, microprocessors, memory circuits, or codecs, to name just a few. Two diagnostic integrated circuits 64 are implemented in the field 60a. Each of the diagnostic integrated circuits 64 includes a plurality of circuit devices that are schematically represented and designated 65. The diagnostic integrated circuits 64 are advantageously implemented as PCMs that are fabricated in concert with the processing to fabricate the integrated circuits 62. The selection of specific types of circuits for implementation in the diagnostic integrated circuits 64 is largely a matter of design discretion. For example, the diagnostic integrated circuits 64 may include an SRAM module, an electrostatic discharge test circuit, capacitors and resistors, transistor structures and various sense amplifiers. The skilled artisan will appreciate that the number of integrated circuits, operational or diagnostic, implemented on a given field is largely a matter of design discretion. For example, a single integrated circuit may be implemented per field or a plurality of integrated circuits as desired.

The aforementioned problems of low yields due to the differences in structural density are alleviated in the structure of the present invention by fabricating the diagnostic integrated circuits 64 with structural densities that are approximately equal to the structural density of each of the integrated circuits 62. Achieving parity between the structural densities of the integrated circuits 62 and the adjacent diagnostic integrated circuits 64 is a relatively straightforward matter where the diagnostic integrated circuits 64 will have approximately the same number of circuit devices as the integrated circuits 62. However, where the diagnostic integrated circuits 62 will not necessarily be fabricated with the same number or configuration of circuit devices as the integrated circuits 62, parity in structural density may still be achieved by fabricating inactive circuit structures into the diagnostic integrated circuits 64 that, while not necessarily providing electronic function in the finished diagnostic integrated circuits 64, will nevertheless provide for a more balanced reaction between various etchants, solvents, etc. and the various films, layers and structures that are simultaneously processed on the integrated circuits 62 and the adjacent diagnostic integrated circuits 64.

The latter of the two aforementioned techniques is illustrated in FIG. 4. Each of the diagnostic integrated circuits 64 is surrounded by a die border 66 that consists of a duplication of the circuit devices implemented in the portion 67 of the integrated circuit 62 that is positioned outside the dashed rectangle 68. The layout of the die borders 66 is determined by taking the layout of one of the integrated circuits 62 and digitally blanking out the portion 69 of the circuit devices thereof positioned inside the dashed rectangle 68 using a layout tool. Any partial polygons, dangling interconnects or other partial structures of the portion 67 remaining after the portion 69 is digitally blanked out are then cleaned up, that is, tied off or otherwise eliminated digitally using the layout tool. The goal of the cleanup is to avoid any structures that could short or otherwise affect the performance of the diagnostic integrated circuits 64. After the digital cleanup step, the layout data for the portion 67 is then added to the layout data for each of the diagnostic integrated circuits 64. When the layout data for the diagnostic integrated circuits 64 is transferred to reticles and ultimately to silicon, the layout data for the portion 67 will be implemented as the die borders 66. The diagnostic integrated circuits 64 are, themselves, implemented in the spaces within the die borders 66. In this way, the structural densities of the diagnostic integrated circuits 64, particularly in the die borders 66, will closely approximate the structural densities of the surrounding integrated circuits 62.

The width, W, of the die borders 66 is selected to ensure sufficient parity in the structural densities of adjacent integrated circuits, particularly near the various scribe lines, such as the lines 52 and 54. Appropriate values for W will depend on a number of factors, such as the types, sizes, and shapes of the operational and diagnostic integrated circuits and scribe lines, and the minimum geometry of the prevailing lithographic patterning technology.

In order to ensure that the effects of process variations, such as those depicted in FIG. 1, are detected by the diagnostic integrated circuits 64, the diagnostic integrated circuits 64 and their corresponding fields 60a, 60b, 60c, 60d, 60e, 60f, 60g and 60h are dispersed in a pattern as shown in FIG. 3. The pattern is selected by first subdividing the plurality of fields 56, 58a, 58b, 58c and 58d and 60a, 60b, 60c, 60d, 60e, 60f, 60g and 60h into n zones where n is an integer. The zones, designated 70, 72, 74, 76, 78, 80 and 82, may be best seen by referring now also to FIG. 5, which is a plan view of the wafer 40 depicting only the fields 60a, 60b, 60c, 60d, 60e, 60f, 60g and 60h selected for the implementation of the diagnostic integrated circuits 64 and the general outline of the plurality of fields 56, 58a, 58b, 58c, 58d, 60a, 60b, 60c, 60d, 60e, 60f, 60g and 60h. For clarity of illustration, the zones 70, 72, 74, 76, 78, 80 and 82 are each provided with a different type of cross hatching. The number and configuration of the zones 70, 72, 74, 76, 78, 80 and 82 are largely matters of design discretion and will depend upon the size and configuration of the plurality of fields 56, 58a, 58b, 58c, 58d, 60a, 60b, 60c, 60d, 60e, 60f, 60g and 60h. In the exemplary embodiment illustrated, seven zones are selected. Statistical calculation has indicated that seven zones provides a statistically significant sampling of the plurality of fields 56, 58a, 58b, 58c, 58d, 60a, 60b, 60c, 60d, 60e, 60f, 60g and 60h.

The fields 60a, 60b, 60c, 60d, 60e, 60f, 60g and 60h are dispersed in a pattern that ensures that the diagnostic integrated circuits 64 depicted in FIG. 4 will be positioned so that electrical and process verification data may be obtained for all of the integrated circuits 62 on the wafer 40. The goal is to insure that test data will be captured from areas of significant process variation across a given wafer, such as the band 38 and the more extensive area 34 depicted in FIG. 1, regardless of the size, shape and actual position of such areas. To ensure that the fields 60a, 60b, 60c, 60d, 60e, 60f, 60g and 60h and their corresponding diagnostic integrated circuits 64 are positioned in a way that will permit detection of areas of process variation, at least one of the fields 60a, 60b, 60c, 60d, 60e, 60f, 60g or 60h is positioned in each of the zones 70, 72, 74, 76, 80 and 82. More than one of the fields 60a, 60b, 60c, 60d, 60e, 60f, 60g or 60h may be positioned in a given zone 70, 72, 74, 76, 80 or 82, if desired, as is the case in the central zone 76. This aspect of the dispersal pattern ensures that areas of process variation that propagate in largely a single direction, such as the expansive area 34 depicted in FIG. 1, will be detected regardless of where the area 34 might originally propagate from.

In addition to dispersal among the zones 70, 72, 74, 76, 80 and 82, the fields 60a, 60b, 60c, 60d, 60e, 60f, 60g and 60h and their corresponding diagnostic integrated circuits 64 are positioned radially at staggered distances from the center point C. The staggered dispersal is such that a circle 84 (shown in dashed) with a radius R drawn from the center point C on the plurality of fields 56, 58a, 58b, 58c, 58d, 60a, 60b, 60c, 60d, 60e, 60f, 60g and 60h will intersect at least one of the plurality of diagnostic integrated circuits 64 where the radius R is greater than or equal to the distance between the center point C and the innermost diagnostic integrated circuit 64 and is less than or equal to the distance between the center point and the outermost diagnostic integrated circuit 64. In the illustrated embodiment in FIGS. 3 and 5, R will be greater than or equal to the distance between the center point C and the diagnostic integrated circuit 64 in either of the fields 60c or 60f that is innermost, that is, closest to the center point C, and less than or equal to the distance between the center point C and the diagnostic integrated circuit 64 that is positioned in the most remote field 60h. In this way, a band of the type shown in FIG. 1 and designated 38 that develops on the wafer 40 during processing will intersect at least one of the diagnostic integrated circuits 64 in one of the fields 60a, 60b, 60c, 60d, 60e, 60f, 60g and 60h regardless of the inner and outer diameters of such a band.

The skilled artisan will appreciate that the structure and method of the present invention enable advantageous fabrication and placement of PCMs on a semiconductor wafer. PCMs may be implemented to provide more functionality than conventional SLMs without yield degradation due to differential structural densities between adjacent fields. Deliberate and selective dispersal of PCMs across a pattern of fields on a wafer ensures that areas of process variation can be characterized regardless of where those areas arise.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor wafer having a plurality of fields formed in a pattern thereon that is subdivided into n zones and has a center point, comprising:
   a plurality of integrated circuits, each of the plurality of integrated circuits being positioned in one of the plurality of fields; and
   a plurality of diagnostic integrated circuits dispersed in a pattern whereby each one of the plurality of diagnostic integrated circuits is positioned in one of the plurality of fields, one of the plurality of diagnostic integrated circuits is positioned in each of the n zones at staggered distances from the center point, and a circle of radius R from the center point will intersect at least one of the plurality of diagnostic integrated circuits where R is greater than or equal to the distance between the center point and the innermost of the plurality of diagnostic integrated circuits and less than or equal to the distance between the center point and the outermost of the plurality of diagnostic integrated circuits.

2. The semiconductor wafer of claim 1, wherein n is equal to seven.

3. The semiconductor wafer of claim 2, wherein one of the n zones encompasses the center point and two of the plurality of fields occupied by two of the plurality of diagnostic integrated circuits.

4. The semiconductor wafer of claim 1, wherein the plurality of diagnostic integrated circuits are positioned in eight of the plurality of fields.

5. The semiconductor wafer of claim 1, wherein a radius drawn from the center point to the outermost edge of the outermost diagnostic integrated circuit and swept through 360° will sweep through all of the plurality of integrated circuits.

6. The semiconductor wafer of claim 1, wherein pairs of the plurality of diagnostic integrated circuits are positioned in a given field of the plurality of fields.

7. The semiconductor wafer of claim 1, wherein each of the plurality of diagnostic integrated circuits is surrounded by a border comprising a plurality of inactivated circuit devices having substantially the same layout as a corresponding plurality of active circuit devices in one of the plurality of integrated circuits.

8. The semiconductor wafer of claim 1, wherein a given diagnostic integrated circuit has approximately the same structural density as those integrated circuits of the plurality of integrated circuits that are positioned adjacent to the given diagnostic integrated circuit.

9. A semiconductor wafer, comprising:
   a plurality of intersecting scribe lines defining a plurality of fields on the semiconductor wafer;
   a plurality of integrated circuits, each of the plurality of integrated circuits being positioned in one of the plurality of fields; and
   a plurality of diagnostic integrated circuits, each of the plurality of diagnostic integrated circuits being positioned in one of the plurality of fields and surrounded by a border having a plurality of inactivated circuit devices having substantially the same structural layout as a corresponding plurality of active circuit devices in one of the plurality of integrated circuits.

10. The semiconductor wafer of claim 9, wherein a given diagnostic integrated circuit has approximately the same structural density as those integrated circuits of the plurality of integrated circuits that are positioned adjacent to the given diagnostic integrated circuit.

11. The semiconductor wafer of claim 9, wherein the plurality of diagnostic integrated circuits are positioned in eight of the plurality of fields.

12. The semiconductor wafer of claim 9, wherein the plurality of fields are dispersed in a pattern on the semiconductor wafer that is subdivided into n zones and has a center point, and whereby one of the plurality of diagnostic integrated circuits is positioned in each of the n zones, and a circle of radius R from the center point will intersect at least one of the plurality of diagnostic integrated circuits where R is greater than or equal to the distance between the center point and the innermost of the plurality of diagnostic integrated circuits and less than or equal to the distance between the center point and the outermost of the plurality of diagnostic integrated circuits.

13. The semiconductor wafer of claim 12, wherein a radius drawn from the center point to the outermost edge of the outermost diagnostic integrated circuit and swept through 360° will sweep through all of the plurality of integrated circuits.

14. The semiconductor wafer of claim 12, wherein one of the n zones encompasses the center point and two of the plurality of fields occupied by two of the plurality of diagnostic integrated circuits.

15. The semiconductor wafer of claim 9, wherein pairs of the plurality of diagnostic integrated circuits are positioned in a given field of the plurality of fields.

16. A semiconductor wafer having a plurality of fields formed in a pattern thereon that is subdivided into seven zones and has a center point, comprising:
   a plurality of integrated circuits, each of the plurality of integrated circuits being positioned in one of the plurality of fields;
   a plurality of diagnostic integrated circuits, each of the plurality of diagnostic integrated circuits being positioned in one of the plurality of fields and surrounded by a border comprising a plurality of inactivated circuit devices having substantially the same structural layout as a corresponding plurality of active circuit devices in one of the plurality of integrated circuits; and
   whereby the plurality of diagnostic integrated circuits is dispersed in a pattern such that one of the plurality of diagnostic integrated circuits is positioned in each of the seven zones at staggered distances from the center point, and a circle of radius R from the center point will intersect at least one of the plurality of diagnostic integrated circuits where R is greater than or equal to the distance between the center point and the innermost of the plurality of diagnostic integrated circuits and less than or equal to the distance between the center point and the outermost of the plurality of diagnostic integrated circuits.

17. The semiconductor wafer of claim 16, wherein one of the seven zones encompasses the center point and two of the plurality of fields occupied by two of the plurality of diagnostic integrated circuits.

18. The semiconductor wafer of claim 16, wherein the plurality of diagnostic integrated circuits are positioned in eight of the plurality of fields.

19. The semiconductor wafer of claim 16, wherein a radius drawn from the center point to the outermost edge of the outermost diagnostic integrated circuit and swept through 360° will sweep through all of the plurality of integrated circuits.

20. The semiconductor wafer of claim 16, wherein pairs of the plurality of diagnostic integrated circuits are positioned in a given field of the plurality of fields.

21. The semiconductor wafer of claim 16, wherein a given diagnostic integrated circuit has approximately the same structural density as those integrated circuits of the plurality of integrated circuits that are positioned adjacent to the given diagnostic integrated circuit.

* * * * *

UNITED STATES PATENT AND TRADEMARK OFFICE
CERTIFICATE OF CORRECTION

PATENT NO: 5,990,488

DATED: November 23, 1999

INVENTOR(S): John L. Nistler et al.

It is hereby certified that error appears in the above-identified patent and that said Letters Patent is hereby corrected as shown below:

In column 1, line 37, delete "modem" and substitute --modern-- therefor;

In column 1, line 45, delete "manufacturer" and substitute --manufacturing--therefor;

In column 2, line 25, delete "date" and substitute --data-- therefor;

In column 4, line 52, delete "fiat" and substitute --flat-- therefor;

In column 4, line 56, delete "20" and substitute --20c-- therefor;

In column 5, line 1, delete "modem" and substitute --modern-- therefor;

In column 6, line 28, delete "high" and substitute --higher-- therefor; and

In column 9, line 61, insert the word --of-- before the word "fields".

Signed and Sealed this

Twenty-fifth Day of July, 2000

Attest:

Q. TODD DICKINSON

Attesting Officer

Director of Patents and Trademarks